United States Patent [19]

Shiba et al.

[11] Patent Number: 4,775,846

[45] Date of Patent: Oct. 4, 1988

[54] UNIDIRECTIONAL SURFACE ACOUSTIC WAVE DEVICE

[75] Inventors: Takashi Shiba, Yokosuka; Yuji Fujita, Yokohama; Toshimitsu Takahashi, Yokohama; Jun Yamada, Yokohama, all of Japan

[73] Assignee: Hitachi, Ltd., Tokyo, Japan

[21] Appl. No.: 97,169

[22] Filed: Sep. 16, 1987

[30] Foreign Application Priority Data

Sep. 19, 1986 [JP] Japan .............................. 61-219351

[51] Int. Cl.$^4$ ...................... H03H 9/145; H03H 9/64; H03H 9/68
[52] U.S. Cl. .................................. 333/194; 333/151; 333/154; 333/195; 333/196; 310/313 B
[58] Field of Search ............................... 333/150–155, 333/193, 194, 195, 196; 310/313 A, 313 B, 313 C, 313 D, 313 R

[56] References Cited

U.S. PATENT DOCUMENTS 4,254,388 3/1981 Mikoshiba et al. ................. 333/195
4,422,000 12/1983 Yamada et al. ................. 333/154 X

OTHER PUBLICATIONS

Yamada et al—"Relation of the Insertion Loss and Triple Tansit Echo in Saw Unidirectional Transducers", Proc. of 3rd Symposium on Ultrasonic Electronics, Tokyo 1982, Japanese Journal of Applied Physics, vol. 22, supplement 22-23, 1983; pp. 163–164.
Meguro et al–"A Flat-Amplitude Surface Acoustic Wave Filter Incorporating a Group Based Unidirectional Transducer" Lectures 1-5-14 Japan Acoustic Academy, Dec. 1976; pp. 153–154.

Primary Examiner—Marvin L. Nussbaum
Attorney, Agent, or Firm—Antonelli, Terry & Wands

[57] ABSTRACT

In order to present an asymmetric frequency characteristic in an unidirectional acoustic surface wave device with a simple external phase shifter, a transducer formed on a substrate have three interaction areas (acoustic sources) defined by different three electrodes, first electrode being common, second electrode being connected to one end of the phase shifter, third electrode being connected to another end of the phase shifter, and distances between interaction areas being unequal to 2n (n:integer).

3 Claims, 4 Drawing Sheets

UNIDIRECTIONAL SURFACE ACOUSTIC WAVE DEVICE

FIELD OF THE INVENTION

This invention relates to a surface acoustic wave (SAW) device with a unidirectional electrode which can reduce insertion loss over a wide band width.

BACKGROUND OF THE INVENTION

One example of the surface acoustic wave device of the unidirectional type is desclosed in the reference entitled "a flat-amplitude surface acoustic wave filter incorporating a group-based unidirectional interdigital electrode array" by Toshiyasu Meguro et al, in December, 1976 in "a Collection of Lectures 1-5-14" of Japan Acoustic Academy. Another example of the undirectional SAW device is desclosed in the copending U.S. patent aplication (Ser. No. 869,979) filed on June 2, 1986 and now U.S. Pat. No. 4,689,586 and in DE-OS No. 3,618,913.

In such unidirectional SAW devices the insertion loss and the distortion in the frequency characteristic can be further reduced over the wide band width. However it is difficult to make such a unidirectional device exhibit asymmetrical amplitude frequency characteristics. In particular, none of the conventional SAW devices suggests a unidirectional SAW device which exhibit such asymmetrical characteristics with a simple external circuit, which may be a single phase shift circuit.

SUMMARY OF THE INVENTION

It is an object of the invention to provide a unidirectional surface acoustic wave device which exhibits asymmetrical frequency chacteristic.

In order to achieve the above object there is provided a surface acoustic wave device comprising a piezo-electric substrate, an input transducer formed on said substrate and connected to a signal source, for conversion of an electric signal from said signal source into a surface acoustic wave, an output transducer formed on said substrate and connected to a load circuit, for conversion of said surface acoustic wave into an electrical signal, at least one of said transducers including a common electrode, a first electrode positioned to form a first interaction area between said common and first electrode, and a second electrode positioned to form second and third interaction areas between said common and second electrodes, a phase shift circuit connected between said first and second electrodes for producing a difference in phase between electrical signals at said first and second electrodes thereby forming an unidirectional transducer. The distance between said second and third interaction area being unequal to N Z where N is any integer and Z is a wave length in which a ratio of radiation energys in opposing directions is a maximum value.

DESCRIPTION OF THE PREFERRED EMBODIMENT

Figure 1:
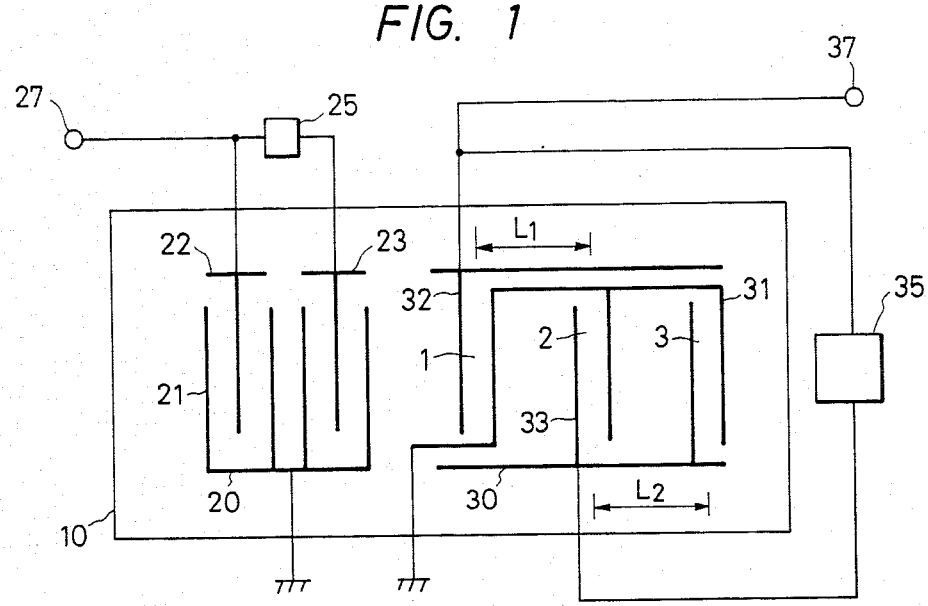
FIG. 1 is a drawing showing a first embodiment of the present invention.

A simple example having three interaction areas in one group of a transducer will be explained. Transfer phases of the surface acoustic waves between first interaction area 1 and other interaction areas 2 and 3 are represented by Pm1 and Pm2. Also it is assumed that interaction areas 2 and 3 are placed between the same kind of electrode (first electrodes) and a common electrode and that the phase shift by the phase shift circuit connected between the first electrode and a second electrode is represented by Pe. When the radiated acoustic presures at each interaction area 1, 2, and 3 are represented by a0, a1, and a3, respectively, the conditions when the energy transferred in a reverse direction is zero are expressed as $$a0 + a1\cos(Pm1 + Pe) + a2\cos(Pm2 + Pe) = 0 \quad (1)$$

$$a1\sin(Pm1 + Pe) + a2\sin(Pm2 + Pe) = 0 \quad (2)$$

By dividing these equations (1) and (2) by a0, the following equations are obtained.

$$1 + \frac{a1}{a0}\cos(Pm1 + Pe) + \frac{a2}{a0}\cos(Pm2 + Pe) = 0 \quad (3)$$

$$\frac{a1}{a0}\sin(Pm1 + Pe) + \frac{a2}{a0}\cos(Pm2 + Pe) = 0 \quad (4)$$

Assuming bs and bc are quadrature and inphase components in the Fourier transformation for the asymmetrical frequency characteristic of the transducer in the forward direction, then the following equation is derived.

$$\frac{\frac{a1}{a0}\sin(Pm1 - Pe) + \frac{a2}{a0}\sin(Pm2 + Pe)}{1 + \frac{a1}{a0}\cos(Pm1 - Pe) + \frac{a2}{a0}\cos(Pm2 + Pe)} = \frac{bs}{bc} \quad (5)$$

Even if Pe is fixed, four variable parameters Pm1, Pm2, a1/a2 and a2/a0 and three equations. Therefore, these parameters can be suitably determined. However, if the difference between Pm1 and Pm2 is an integer multiple of 2, then Pm1=Pm2 if the phase rotation is subtracted. Consequently, the phase is determined according to equations (3) and (4) under any values of a1/a0 and a2/a0. Thus an arbitrary value for bs/bc cannot be obtained if the difference between Pm1 and Pm2 is an integer multiplen of 2. Also in the case where the number of interaction areas is two or less, assuming the parameters are unconditionally determined, then Pe is so varied that the number of phase shift circuits are increased. Thus, if the number of interaction areas in one group is three and Pm2 is unequal to Pm1+2n (n: integer), then, even if electrical phase differences Pe in each of the groups are the same, the quadrature component in each group can be freely, chosen. Therefore, there is provided one common external phase shift circuit in order to obtain the asymmetric frequency characteristic.

While in the case where there are n+1 interaction areas in one group, the conditions under which the energy for transfer in the reverse direction is zero are similarly expressed as $$a0 + a1\cos(Pm1 + Pe) + a2\cos(Pm2 + Pe) + \ldots \quad (6)$$
$$\ldots + an\cos(Pn2 + Pe) = 0$$

$$a1\sin(Pm + Pe) + a_2\sin(Pm2 + Pe) + \ldots \quad (7)$$
$$\ldots + an\sin(Pmn + Pe) = 0$$

and from the condition that the ratio between the quadrature component and inphase component in the forward direction is given by bs/bc, the following equation is obtained.

$$\frac{a1\sin(Pm1 - Pe) + a2\sin(Pm2 - Pe) + \ldots + an\sin(Pmn - Pe)}{a0 + a1\cos(Pm1 - Pe) + a2\cos(Pm2 - Pe) + \ldots + an\cos(Pmn - Pe)} = bs/bc \quad (8)$$

There are three conditional expressions (6), (7) and (8), and 2n variable parameters Pm1 to Pmn, and a1/a0 to an/a0. Since 2n>3 holds when N+1 is three or above, and if at least one of the variable parameters is independent (i.e. out of phase with phase rotation taken into consideration), an arbitrary value of bs/bc is achieved with the value of Pe being the same for each group.

In FIG. 1. on elastic substrate 10 there are provided input transducer 20 having common electrode 21, first electrode 22 and third electrode 23 for converting an input signal applied to input terminal 27 into a surface acoustic wave to launch it toward output transducer 30. Output and output transducer 30 having common electrode 31, first electrode 32 and third electrode 33 for receiving the surface acoustic wave from input transducer 20 converts the surface acoustic wave into an output signal at output terminal 37. Phase shift circuit 25 is connected between first electrode 22 and second electrode 23 in transducer 20 which operates as an unidirectional device with asymmetric frequency characteristics. Phase shift circuit 35 is connected between first electrode 32 and second electrode 33 in transducer 30 which operates as an unidirectional device with the asymmetric frequency characteristics.

Now it is assumed that the ratio between quadrature and inphase components is bs/ba=2+√3 according to a given frequency characteristic. Also the acoustic pressures at interaction areas 1, 2, and 3 are represented by a0, a1 and a3 (which are determined in this case chiefly by the number of pairs of interdegital electrode defining interactive areas). Representing the transfer phase between areas 1 and 2 by Pm1, the transfer phase between 1 and 3 by Pm2, the desired frequency of the band pass of transducer 30 by f, the average acoustic velocity of the surface acoustic wave within the interdegital electrodes by Ve, and the wave length thereof by λ. Since distances L1 and L2 coincide with the distances between interaction areas, Pm1 and Pm2 are given by $$Pm1 = \frac{2\pi L1 f}{Ve} = \frac{2\pi L1}{\lambda} \quad (9)$$

$$Pm2 = \frac{2\pi L2 f}{Ve} = \frac{2\pi L2}{\lambda} \quad (10)$$

If the phase shift in the external phase shifter is represented by Pe, the conditions of the power of the surface wave radiated in the reverse direction being zero are expressed as equations (3) and (4), and the condition in the forward direction is expressed from equation (5) as $$\frac{\frac{a1}{a0}\sin(Pm1 - Pe) + \frac{a2}{a0}\sin(Pm2 - Pe)}{1 + \frac{a1}{a0}\cos(Pm1 - Pe) + \frac{a2}{a0}\cos(Pm2 - Pe)} = 2 + \sqrt{3} \quad (11)$$

Assuming that Pe=15 degrees and a1/a0=1, following values are obtained.

Pm1=105 degrees, Pm2=225 degrees and a1/a0=1

Figure 2:
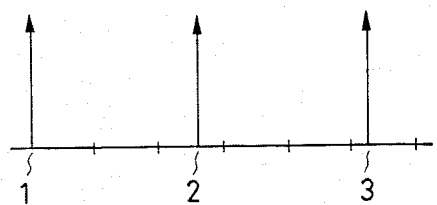
FIG. 2 is a drawing showing positions of interreaction areas in the embodiment shown in FIG. 1.
Figure 3:
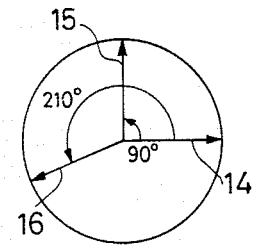
FIGS. 3 and 4 are vector diagrams of responses at interreaction areas in the embodiment shown in FIG. 1.
Figure 4:
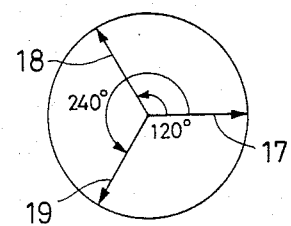

The distribution for interactive areas along the time axis in the case where the phase shift circuit is not used (shorted between first and second electrodes), acoustic pressure interaction areas 1, 2 and 3 are distributed at phase differences of 105 degrees and 225 degrees as shown in FIG. 2. Assuming the acoustic pressures in the forward direction can be represented by vectors, as shown as FIG. 3 with the angle of the vector corresponding to time. Since the inphase component (abscissa axis component) and the quadrature component (ordinate axis component) of the composed vector summed with vectors 14, 15 and 16 are $1-\sqrt{3}/2$, and ½, respectively, the ratio between $1-\sqrt{3}/2$ and ½ becomes $2+\sqrt{3}$. FIG. 4 is the vector diagram seen in the reverse direction, wherein vectors 17, 18 and 19 represent the acoustic pressures at interactive areas 1, 2 and 3 for the acoustic wave propagating in the reverse direction. Since the vectors are at phase difference of 120 degrees with each other and equal in magnitude, it is obvious that their vector sum is zero.

While the case where one group of unidirectional electrodes is used in the above embodiment, it of course is possible to use plural groups of unidirectional electrodes to achieve virtually any desired frequency characteristic.

Figure 5:
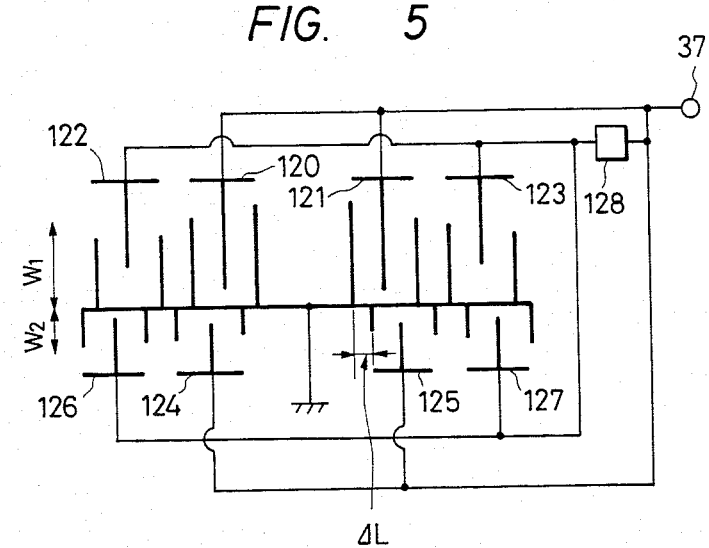
FIGS. 5 and 10 are drawings showing other embodiments of the present invention.

FIG. 5 is a drawing schematically showing output weighting of unidirectional electrodes of a second embodiments of the present invention. Interdigital electrodes 120 and 121 are connected in parallel and interdigital electrodes 122 and 123 are also connected in parallel. Interdigital electrodes 121 and 123, and interdigital elecyrodes 120 and 122, are each connected through phase shift circuit 128 to form a group. Also the sets connected in parallel of interdigital electrodes 124 and 125, and 126 and 127, are connected in like manner through phase shift circuit 128. The groups of interdigital electrodes 120 to 123 and 124 to 127 are disposed a distance ΔL (≠n, n: integer) apart in the direction of propagation of the surface wave. Since the groups of interdigital electrodes are arranged symmetrically on the left and right, the group delay characteristic on the axis of frequency becames flat. We now assume that the number of pairs of each of the interdigital electrodes are the same. Since the above mentioned unidirectional electrodes are symmetrical on the left and right, the sets of interdigital electrodes 121, 123,125 and 127 will be considered. When the transfer phase between interdigital electrodes 121 and 123 is represented by Pm the same as in the first embodiment, and the phase shift in phase shift circuit 128 by Pe, the condition under which the energy transfer in the reverse direction is zero expressed as Pm+Pe=180 degrees (12)

We represent the transfer phase between interdigital electrodes 125 and 127 also by Pm, set ΔL as $$L = \lambda/4 \quad (13)$$

and set Pe at 90 degrees. From equation (12), Pm=90 degrees is derived and the ratio between the quadrature component and the inphase component, bs/bc, in the above group is determined from equation (13) by the ratios of the aperture of interdigital electrodes 121, 123 and 125, 127 and expressed as $$W2/W1 = bs/bc \quad (14)$$

While the degree of freedom in designing was small in the first embodiment because a0, a1, a2 were allowd only to take the value proportional to the square of the number of pairs, the second embodiment has an advantage in that, even if Pe is set constant for each group, bs/bc can be freely selected as described above by suitably selecting W1 and W2. Although, in the above embodiment, Pe was set as Pe=90 degrees, Pm and Pe satisfying equation (12) can be freely selected and L can also be freely selected. While the case of eight interdigital electrodes, four groups, was shown in the above embodiment, it is possible to achieve the desired frequency characteristics by increasing the number of groups. Also, when using the present embodiment, by arranging the above interdigital electrodes in a line-symmetrical manner about the axis in the direction of propagation with respect to the geometrical center of the unidirectional electrodes or in a point-symmetrical manner about the center, it becomes possible to keep the group delay time virtually constant within the bandwidth.

Figure 6:
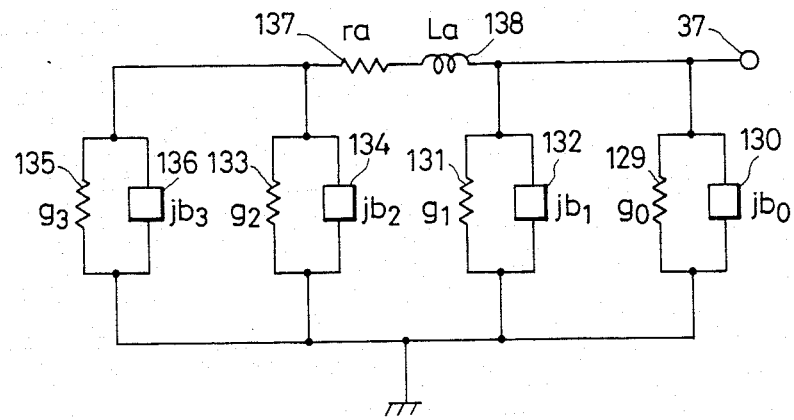
FIGS. 6 and 8 are drawings showing equivalent circuits for other embodiments.

FIG. 6 shows an equivalent circuit diagram for the second embodiment. For phase shift circuit 128, a vessel type phase shifter consisting of a resistor 137 (resistance value: ra) and inductor 138 (inductance value: La) was used. The value of radiation conductance 129 of interdigital electrodes 120 and 121 is represented by go and the value of equivalent suseptance 130 by jbo. Likewise, 131 (g1) and 132 (jb1) correspond to interdigital electrodes 122 and 123, and 135 (g3) and 136 (jb3) correspond to interdigital electrodes 126 and 127. Since the number of pairs of each of the electrodes are equal, we obtain $$go = g2, g1 = g3$$

$$bo = b2, b1 = b3$$

and representing as $$G = g0 + g1 = g2 + g3 \quad (15)$$

$$B = b0 + b1 = b2 + b3 \quad (16)$$

Pe=90 degrees is achieved by setting as $$ra = \frac{B - G}{G^2 + B^2} \quad (17)$$

$$La = \frac{1}{\omega} \cdot \frac{B + G}{G^2 + B^2} \quad (18)$$

where is a desired angular frequency.

Figure 7:
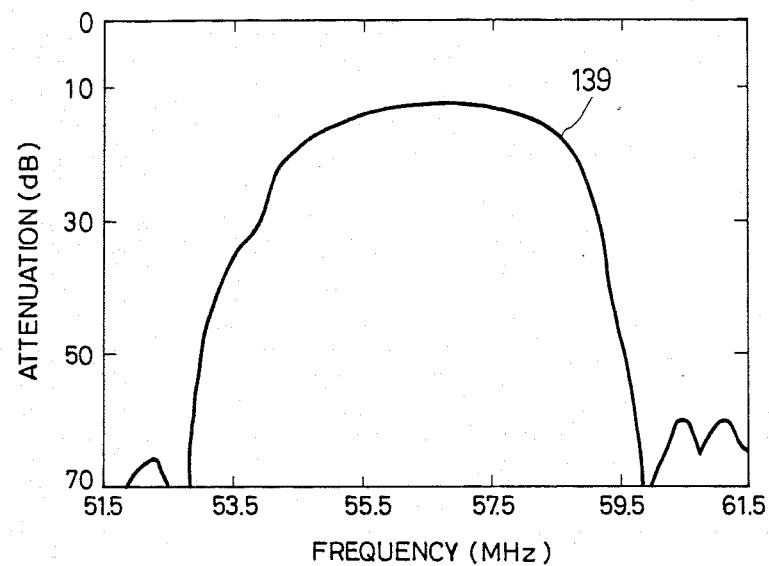
FIGS. 7 and 9 are drawings showing frequency characteristics of other embodiments.

FIG. 7 shows the frequency characteristic of the device designed, for trial, as an intermediate frequncy filter for a television receiver on the basic construction as that of the second embodiment in which there is provided 120 interdegital electrodes in 60 groups as the output transducer and 8 groups of conventional unidirectional electrodes as the input transducer. As the substrate, 128 Y-cut LiNbO$_3$ with the X axis taken the direction of propagation was used, and electrodes was formed of a thin A1 film 7000 Å thick made by photolithography and provided with a 2000 μm aperture. Equivalent circuit constants Gi, Bi, Go and Bo of the input and output transducers at 56.5 MHz were obtained by measurment as $$Gi = 2.2 \, ms, \, Bi = 4.8 \, mS$$

$$Go = 1.5 \, mS, \, Go = 4.5 \, mS$$

From these values, using equation (17), (18), constants for phase shifter were obtained. The constants for the phase shifter for the input transducer were $$ra = 93\Omega, \, la = 0.72 \, \mu H$$

and for the output side were $$ra = 130\Omega, \, La = 0.75 \, \mu H$$

Therefore elements having these values were used for the phase shifters. Input and output impedances were set at 140Ω and 170Ω, and and matching was provided by parallel inductances of 0.59 μH and 0.63 μH. Under these conditions, the asymmetric frequency characteristic with a loss 12 dB as shown in FIG. 7 was obtained.

Figure 8:
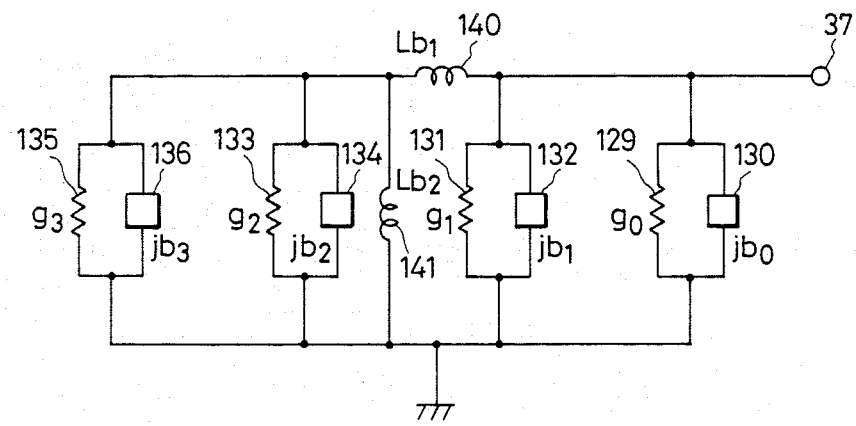

FIG. 8 shows a third embodiment in which unidirectional electrodes the same as above were used only pure reactance elements were used for phase shifters. As the phase shifters, inductor 140 (Lb1) and inductor 141 (Lb2) were used. The above inductance values can be expressed using G, B as $$Lb1 = \frac{1}{\omega G} \quad (19)$$

$$Lb2 = \frac{1}{\omega} \cdot \frac{1}{B - G} \quad (20)$$

Using equations (19) and (20), values of the phase shifter for the input transducer are obtained as $$Lb1 = 1.3 \, \mu H, \, Lb2 = 1.1 \, \mu H$$

Similarly, values of the phase shifter for the output transducer are obtained as $$Lb1 = 1.9 \, \mu H, \, Lb2 = 0.94 \, \mu H$$

Figure 9:
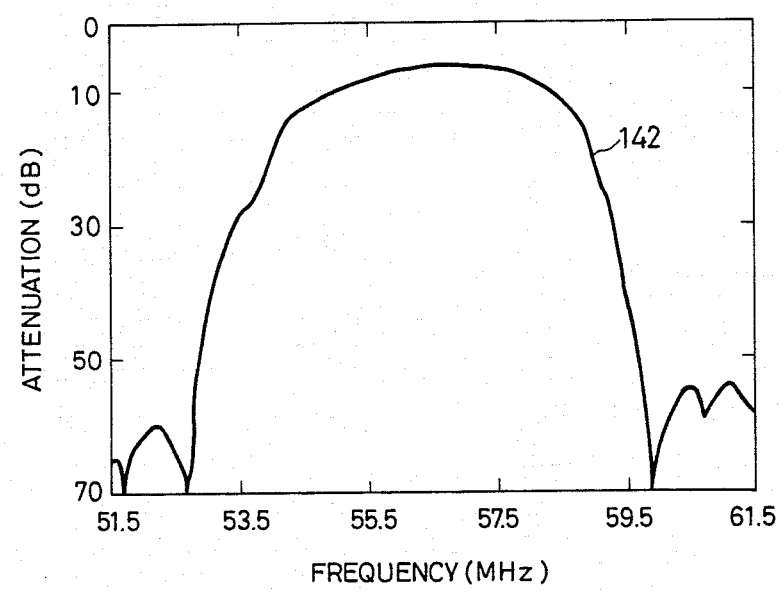

The impedance on the input side was set at 230Ω and matching was provided by using a parallel inductance of 1.1 μH. The output impedance was set at 330Ω and matching was provided by using a parallel inductance of 0.94 μH. FIG. 9 shows the resultant frequency characteristic. The amplitude characteristic 142 is provided with an asymmetric characteristic with a loss of 6 dB. Since pure reactance elements are used for phase shifters in the present embodiment, an advantage is obtained in that there is no loss due to resistance.

Figure 10:
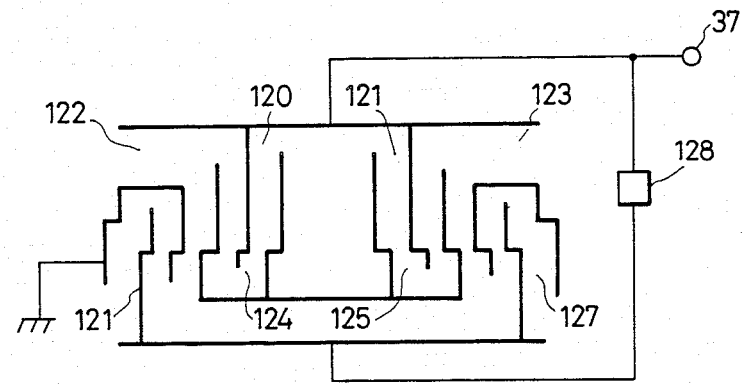

FIG. 10 shows a fourth embodiment. Since the electrical wiring in the second embodiment of FIG. 5 was of a crossover (multilevel crossing) structure, it had a disadvantage that the manufacturing process, is more complicated when the wiring was executed by photolithography. The fourth embodiment has solved such a problem, in that, the crossover is eliminated by connecting the electrodes arranged in the direction of the aperture.

We claim:

1. A surface acoustic wave device comprising:
a piezo-electric substrate;
and input transducer formed on said substrate and connected to a signal source, for conversion of an electric signal from said signal source into a surface acoustic wave;
an output transducer formed on said substrate and connected to a load circuit, for conversion of said surface acoustic wave into an electric signal;
a propagation path on which said surface acoustic wave propagates from said input transducer to said output transducer;
at least one of said transducers including a common electrode, a first electrode to form a first interaction area between said common and first electrode and a second electrode to form second and third interaction areas between said common and second electrodes, the distance between the centers of said second and third interaction areas being of any value of $N \times Z$, where N is any integer and Z is a wave length, excluding a distance where the value of Z corresponds to when a propagation energy ratio is a maximum value wherein said propagation energy ratio is a ratio of propagation energy of the surface acoustic wave at said propagation path and propagation energy of the surface acoustic wave outside of said propagation path; and
a phase shift circuit connected between said first and second electrodes for causing a difference in phase between electrical signals at said first and second electrodes so that the propagation energy of said surface acoustic wave outside of said propagation path is reduced.

2. A surface acoustic wave device in accordance with claim 1, wherein said device satisfies following three equations, $$a0 + a1\cos(Pm1 + Pe) + \ldots + an\cos(Pmn + Pe) = 0$$

$$a1\sin(Pm1 + Pe) + \ldots + an\sin(Pmn + Pe) = 0$$

$$\frac{a1\sin(Pm1 - Pe) + \ldots + an\sin(Pmn - Pe)}{a0 + a1\cos(Pm1 - Pe) + \ldots + an\cos(Pmn - Pe)} = \frac{bs}{bc}$$

wherein
$a0, a1, \ldots an$ are acoustic pressures at said interaction areas,
$Pm1, Pm2, \ldots Pmn$ are transfer phases for said acoustic surface wave transferred between said interaction areas,
$Pe$ is the phase shifted by said phase shift circuit, and
$bs/bc$ is the ratio between quadrature and inphase components in the Fourier transformation for a frequency characteristic in each transducer.

3. A surface acoustic wave device comprising:
a piezo-electric substrate;
an input transducer formed on said substrate and connected to a signal source for conversion of an electric signal from said signal source into a surface acoustic wave;
an output transducer formed on said substrate and connected to a load circuit, for conversion of said surface acoustic wave into an electric signal;
a propagation path on which said surface acoustic wave propagates from said input transducer to said output transducer;
at least one of said transducers including a common electrode, a first electrode to form a first interaction area between said common and first electrodes, a second electrode to form a second interaction area between said common and second electrodes, a third electrode to form a third interaction area between said common and third electrodes, a fourth electrode to form a fourth interaction area between said common and fourth electrodes, a fifth electrode to form a fifth interaction area between said common and fifth electrodes, a sixth electrode to form a sixth interaction area between said common and sixth electrodes, a seventh electrode to form a seventh interaction area between said common and seventh electrodes, and an eighth electrode to form an eighth interaction area between said common and eighth electrodes, the distance between the centers of adjacent pairs of interaction areas being of any value of $N \times Z$, where N is any integer and Z is a wave length, excluding a distance where the value of Z corresponds to when a propagation energy ratio is a maximum value wherein said propagation ratio is a ratio of propagation energy of the surface acoustic wave at said propagation path and propagation energy of the surface acoustic wave outside of said propagation path; and
a phase shift circuit connected between a first group of said electrodes and a second group of said electrodes for causing a difference in phase between electrical signals at said first and second groups of electrodes, so that said propagation of said surface acoustic wave outside of said propagation path is reduced.

* * * * *